(12) United States Patent
Cherko

(10) Patent No.: US 6,287,382 B1
(45) Date of Patent: Sep. 11, 2001

(54) ELECTRODE ASSEMBLY FOR ELECTRICAL RESISTANCE HEATER USED IN CRYSTAL GROWING APPARATUS

(75) Inventor: Carl F. Cherko, St. Charles, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 09/170,789

(22) Filed: Oct. 13, 1998

(51) Int. Cl.$^7$ .................................................. C30B 15/10
(52) U.S. Cl. ........................... 117/208; 117/215; 117/217
(58) Field of Search .................................. 117/217, 215, 117/208

(56) References Cited

U.S. PATENT DOCUMENTS

| | | | |
|---|---|---|---|
| 3,039,071 | 6/1962 | Ford ........................ | 338/294 |
| 4,784,715 | * 11/1988 | Stoll ........................ | 117/217 |
| 4,973,454 | * 11/1990 | Morioka et al. ........... | 117/217 |
| 5,137,699 | * 8/1992 | Azad ........................ | 117/217 |
| 5,330,729 | * 7/1994 | Oda et al. ................. | 117/217 |
| 5,698,029 | * 12/1997 | Fujikawa et al. .......... | 117/204 |
| 5,766,346 | * 6/1998 | Hayashi et al. ............ | 117/208 |
| 5,766,347 | * 6/1998 | Shimomura et al. ....... | 117/217 |
| 5,871,582 | * 2/1999 | Kawashima ............... | 117/208 |
| 5,887,015 | * 3/1999 | Mitamura et al. ......... | 373/38 |
| 5,968,266 | * 10/1999 | Iino et al. .................. | 117/217 |

FOREIGN PATENT DOCUMENTS

| | | |
|---|---|---|
| 0 499 471 A1 | 2/1992 | (EP) . |
| 60221391 | 6/1985 | (JP) . |
| 10087393 | 7/1998 | (JP) . |

\* cited by examiner

*Primary Examiner*—Robert Kunemund
(74) *Attorney, Agent, or Firm*—Senniger, Powers, Leavitt & Roedel

(57) ABSTRACT

An electrode assembly for use with an electrical resistance heater mounted in a housing of a crystal puller used for growing monocrystalline silicon ingots according to the Czochralski method comprises an electrode having a first end in electrical connection with the heater within the housing and an outer end. The electrode extends through the crystal puller housing such that the outer end of the electrode is generally external of the housing. The portion of the electrode within the housing is generally solid in cross-section along the entire length of said portion and free of any internal cooling passages. An electrical conductor is electrically connected to a portion of the electrode extending externally of the housing for supplying electrical current to the electrode from a source of electrical current for conduction inward along the electrode to the heater located in the housing. The electrical conductor is also in thermally conductive engagement with the external portion of the electrode and has an internal passage extending therethrough for receiving cooling media in the conductor for use in extracting heat from the external portion of the electrode.

19 Claims, 2 Drawing Sheets

ELECTRODE ASSEMBLY FOR ELECTRICAL RESISTANCE HEATER USED IN CRYSTAL GROWING APPARATUS

BACKGROUND OF THE INVENTION

The present invention relates generally to crystal growing apparatus used in growing monocrystalline silicon ingots, and more particularly to an electrode assembly for conducting electrical current to an electrical resistance heater used in such a crystal growing apparatus.

Single crystal silicon, which is the starting material for most semiconductor electronic component fabrication, is commonly prepared by the so-called Czochralski ("Cz") method. The growth of the crystal is most commonly carried out in a crystal puller. In this method, polycrystalline silicon ("polysilicon") is charged to a crucible and melted by a heater surrounding the outer surface of the crucible side wall. A seed crystal is brought into contact with the molten silicon and a single crystal ingot is grown by slow extraction via a crystal pulling mechanism. After formation of a neck is complete, the diameter of the crystal ingot is enlarged by decreasing the pulling rate and/or the melt temperature until the desired or target diameter is reached. The cylindrical main body of the crystal, which has an approximately constant diameter, is then grown by controlling the pull rate and the melt temperature while compensating for the decreasing melt level. Near the end of the growth process, the crystal diameter must be reduced gradually to form an end-cone. Typically, the end-cone is formed by increasing the pull rate and heat supplied to the crucible. When the diameter becomes small enough, the ingot is then separated from the melt.

Commonly used heaters for melting silicon in the crucible are electrical resistance heaters in which an electrical current flows through a heating element constructed of a resistive heating material (e.g., graphite). The resistance to the flow of current generates heat that radiates from the heating element to the crucible and silicon contained therein. The heating element comprises vertically oriented heating segments of equal length and cross-section arranged in side-by-side relationship and connected to each other in a serpentine configuration. That is, adjacent segments are connected to each other at the tops or bottoms of the segments in an alternating manner to form a continuous electrical circuit throughout the heating element. The heating power generated by the heating element is generally a function of the cross-sectional area of the segments.

These heaters are mounted generally at the bottom of the crystal puller housing, which is constructed of steel. An electrode assembly includes a copper electrode that extends up through the bottom of the housing for electrical connection with the heating element of the heater. The other end of the electrode is electrically connected to power cables external of the housing so that electrical current drawn by the cables from a source of electrical current is conducted through the electrode to the heating element for operation of the electrical resistance heater. As the heating element radiates heat, the electrode is exposed to severe thermal loading. Since copper cannot withstand high thermal loads, the copper electrodes are constructed as tubes having a central cooling passage through which cooling water is directed along the length of the electrode to cool the electrode. As such, the diameter of the electrode must be relatively large to allow both sufficient mass to carry the necessary electrical load and passage for the cooling water.

It has recently been discovered that the quality of crystal ingots grown according to the Czochralski growth method can be improved by controlling the axial thermal gradient of the ingot as it cools during its ascent through the growth chamber and upper pull chamber. The thermal gradient is controlled using heat shielding and/or a second electrical resistance heater mounted in the upper pull chamber of the housing adjacent the dome-shaped transition portion. The heater includes a heating element that extends downward into the crystal growth chamber, terminating substantially above the crucible containing the molten source material. A central opening of the heating element allows the growing ingot to pass centrally through the heating element as it is pulled upward through the housing of the puller. Mounting brackets are electrically connected to the top of the heating element for mounting the heater on the wall of the upper pull chamber. Openings in the wall of the upper pull chamber allow the mounting brackets to be electrically connected to a source of electrical current external of the housing.

Because of radial space limitations present in conventional crystal pullers, installing a second heater in the upper pull chamber and connecting the heater to a source of electrical current presents a difficult challenge. For example, the diameter of the upper pull chamber in crystal pullers used for growing ingots having diameters up to 200 mm is typically about 350 mm. This leaves only a small amount of radial spacing for the heater and a suitable electrode assembly for establishing an electrical circuit between the heating element and the source of electrical power and for adequately cooling the electrode. Mounting the second heater in the upper pull chamber of existing crystal pullers requires an expensive adapter disposed between the upper pull chamber and the dome-shaped transition portion of the housing. The expense and complexity of the adapter increases as the height of the adapter increases. Thus, it is desirous to minimize the required height of the adapter.

Conventional water-cooled copper electrode assemblies, such as that described above for use in supplying the crucible heater with electrical current, are undesirable for use with a heater mounted in the upper pull chamber of the crystal puller. The need to provide cooling water internally throughout the electrode results in an electrode having a significant diameter to allow both sufficient mass to carry the necessary electrical load and passage for the cooling water. The overall cross-sectional dimension of the electrode is thus also significant, thereby increasing the height requirement of the adapter. In addition, the water-cooled copper electrode consumes considerable space in locating it within the upper pull chamber wall for connection with the heating element.

SUMMARY OF THE INVENTION

Among the several objects and features of the present invention may be noted the provision of a crystal puller having an electrode assembly capable of conducting electrical current to an electrical resistance heater mounted in an upper pull chamber of the puller; the provision of such a crystal puller in which the electrode assembly is compact; the provision of such a crystal puller in which the electrode assembly is sized smaller than conventional water-cooled copper electrode assemblies; the provision of such a crystal puller in which the electrode assembly is capable of withstanding severe thermal loads caused by heat radiated from the heater mounted in the upper pull chamber; the provision of such a crystal puller in which the electrode assembly is sealed to maintain the environment within the crystal puller; the provision of such a crystal puller in which the electrode is cooled externally of the crystal puller; and the provision of an electrode assembly which requires a less expensive adapter to modify existing crystal pullers for incorporating an electrical resistance heater in the upper pull chamber of the puller.

Generally, a crystal puller of the present invention for growing monocrystalline silicon ingots according to the Czochralski method comprises a housing and a crucible in the housing for containing molten silicon. A pulling mechanism is provided for pulling a growing ingot upward from the molten silicon. A heater is located in the housing for radiating heat within the housing. An electrode has a first end in electrical connection with the heater within the housing and an outer end. The electrode extends through the crystal puller housing such that the outer end of the electrode is generally external of the housing. The portion of the electrode within the housing is generally solid in cross-section along the entire length of said portion and free of any internal cooling passages. An electrical conductor supplies electrical current to the outer end of the electrode from a source of electrical current for conduction inward along the electrode to the heater located in the housing.

In another embodiment, an adapter of the present invention for use in modifying a crystal puller used for growing monocrystalline silicon ingots according to the Czochralski method to mount a heater in a housing of the puller comprises a generally tubular extender sized for insertion between separable growth chamber and pull chamber components the housing such that the extender partially defines the housing. The adapter has an opening therein to permit access to the heater from exterior of the housing for conducting electrical current to the heater from a source of electrical current located external of the housing. Connecting flanges are attached to the top and bottom of the extender for use in connecting the extender to the growth chamber and pull chamber of the housing.

In yet another embodiment, an electrode assembly for use with an electrical resistance heater mounted in a housing of a crystal puller used for growing monocrystalline silicon ingots according to the Czochralski method comprises an electrode having a first end in electrical connection with the heater within the housing and an outer end. The electrode extends through the crystal puller housing such that the outer end of the electrode is generally external of the housing. The portion of the electrode within the housing is generally solid in cross-section along the entire length of said portion and free of any internal cooling passages. An electrical conductor is electrically connected to a portion of the electrode extending externally of the housing for supplying electrical current to the electrode from a source of electrical current for conduction inward along the electrode to the heater located in the housing. The electrical conductor is also in thermally conductive engagement with the external portion of the electrode and has an internal passage extending therethrough for receiving cooling media in the conductor for use in extracting heat from the external portion of the electrode.

Other objects and features of the present invention will be in part apparent and in part pointed out hereinafter.

BRIEF DESCRIPTION OF THE DRAWINGS

Corresponding reference characters indicate corresponding parts throughout the several views of the drawings.

DETAILED DESCRIPTION OF THE PREFERRED EMBODIMENT

Figure 1:
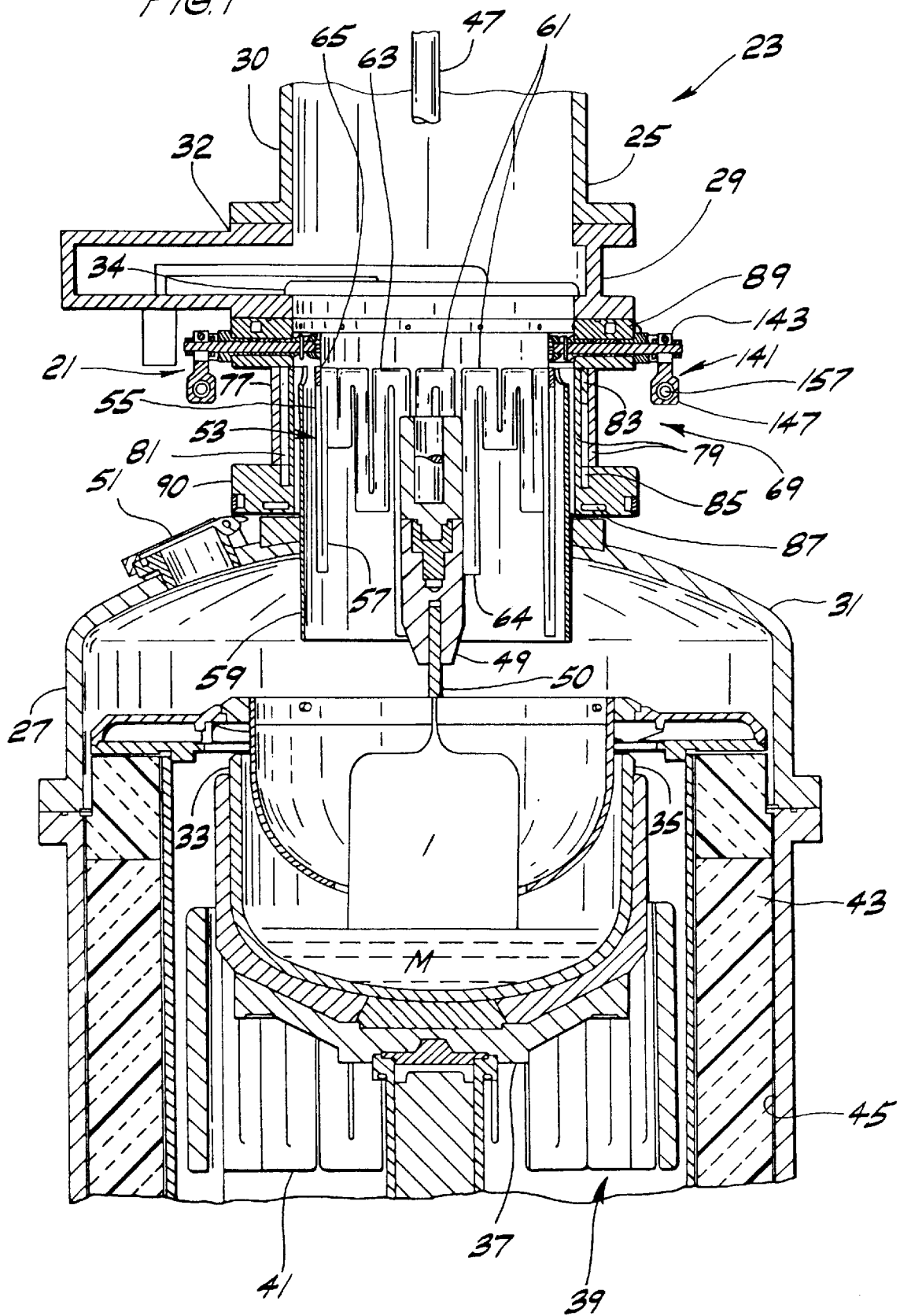
FIG. 1 is a schematic, fragmentary vertical section of a crystal puller showing an electrical resistance heater mounted in an upper pull chamber of the puller and a pair of electrode assemblies of the present invention for use with the electrical resistance heater.

Referring now to the drawings and in particular to FIG. 1, a pair of electrode assemblies constructed according to the principles of the present invention are generally indicated at 21. The electrode assemblies are preferably for use in a crystal puller, indicated generally at 23, of the type used to grow monocrystalline silicon ingots (e.g., ingot I of FIG. 1) according to the Czochralski method. The crystal puller 23 includes a housing (generally indicated at 25) comprising a generally cylindrical growth chamber 27, and a generally cylindrical pull chamber (indicated generally at 29) above the growth chamber. The pull chamber 29 has a smaller transverse dimension than the growth chamber 27. The growth chamber 27 includes a dome-shaped transition portion 31 in which the diameter of the growth chamber decreases generally to that of the pull chamber 29.

A quartz crucible 33 disposed in the growth chamber 27 contains molten semiconductor source material M (e.g., silicon) from which the monocrystalline ingot I is grown. The crucible 33 includes a cylindrical side wall 35 and is mounted on a turntable 37 for rotation about a vertical axis. The crucible 33 is also capable of being raised within the growth chamber 27 to maintain the surface of the molten source material M at the same level as the ingot I is grown and source material is removed from the melt.

A crucible heater, generally indicated at 39, for melting the source material M in the crucible 33 includes a generally vertically oriented heating element 41 surrounding the crucible in radially spaced relationship with the crucible side wall 35. The heating element 41 heats the crucible 33 to temperatures above the melting point of the source material M. Insulation 43 is positioned to confine the heat to the interior of the growth chamber 27. In addition, there are passages in the growth chamber 27 and upper pull chamber 29, for allowing circulation of cooling water. Some of these passages are designated by the reference numeral 45 in FIG. 1.

A crystal pulling mechanism includes a pull shaft 47 extending down from a mechanism (not shown) above the pull chamber 29 capable of raising, lowering and rotating the pull shaft. The crystal puller 23 may have a pull cable (not shown) rather than a shaft 47, depending upon the type of puller. The pull shaft 47 terminates in a seed crystal chuck 49 which holds a seed crystal 50 used to grow the monocrystalline ingot I. The pull shaft 47 has been partially broken away in FIG. 1 for clarity in illustration of a raised position of the seed chuck 49 and ingot I. A view port 51 in the transition portion 31 of the growth chamber 27 provides for viewing of the liquid/solid interface between the ingot I and the melt surface of the molten source material M by a conventional ingot diameter control device, such as a camera control device (not shown). The general construction and operation of the crystal puller 23 is well known to those of ordinary skill in the art and will not be further described except to the extent explained more fully below.

In the preferred embodiment of FIG. 1, the upper pull chamber 29 comprises that portion of the puller housing 25 above the transition portion 31 of the growth chamber 27, including a receiving chamber 30, an isolation valve housing 32 connected to the bottom of the receiving chamber and an adapter, generally indicated at 69, intermediate the valve housing and the transition portion 31 of the growth chamber 27. It is understood, however, that the pull chamber 29 may comprise only the receiving chamber 30, or the receiving chamber and isolation valve housing 32 and remain within the scope of this invention. It is also contemplated that the adapter 69 may be integrally formed with the isolation valve housing 32, the transition portion 31 of the growth chamber 27, or both, without departing from the scope of this invention. A generally disk-shaped isolation valve 34 is disposed in the valve housing 32 for selectively sealing the growth chamber 27 so that the receiving chamber 30 may be separated from the puller housing 25 while the operating temperature and vacuum within the growth chamber is maintained. Separation of the receiving chamber 30 from the housing 25 provides access to the interior of the receiving chamber for installing the seed 50 in the seed chuck 49 or performing other operations.

A second, or upper electrical resistance heater, generally indicated at 53, comprises a tubular heating element 55 mounted in the adapter 69 of the upper pull chamber 29 for reducing the rate of cooling of the growing ingot I as the ingot is pulled upward within the housing. A central opening 57 of the heating element 55 allows the growing ingot I to pass centrally through the heating element as it is pulled upward past the heater 53. The heating element 55 extends downward a predetermined distance into the crystal growth chamber 27, terminating substantially above the crucible 33 containing the molten source material M. However, it is understood that the heating element 55 may not extend down into growth chamber 27 at all, so that the entire heating element is disposed within the pull chamber 29, without departing from the scope of this invention.

The length of the heating element 55 is such that it extends upward within the pull chamber 29 to a predetermined height based on the desired amount of heat to be radiated to the growing ingot I and the axial portion of the ingot to which the heat is to be radiated. Where an isolation valve housing 32 is used, the heating element cannot extend above the isolation valve 34 in the housing. A tubular heat shield 59, preferably constructed of graphite, is disposed generally between the heating element 55 and the wall of the upper pull chamber 29 to inhibit cooling of the heating element by the water-cooled walls of the growth chamber 27 and pull chamber.

The heating element 55 comprises vertically oriented heating segments 61 arranged in side-by-side relationship and connected to each other to form an electrical circuit. More particularly, upper and lower ends, designated 63 and 64, respectively, of adjacent heating segments 61 are alternatingly connected to each other in a continuous serpentine configuration forming a closed geometric shape; preferably a cylinder. Opposing mounting brackets 65 are connected to the top of the heating element 55 in electrical connection with the heating segments 61 and extend upward from the heating element. Openings 67 are provided adjacent the top of the mounting brackets 65 for use in mounting the heating element 55 within the pull chamber 29 of the housing 25 in a manner described hereinafter.

The heating element 55 is constructed of a non-contaminating resistive heating material which provides resistance to the flow of electrical current therethrough; the power output generated by the heating element increasing with the electrical resistance of the material. A particularly preferred resistive heating material is highly purified iso-molded graphite. However, the heating element 55 may be constructed of silicon carbide coated graphite, extruded graphite, carbon fiber composite, tungsten, metal or other suitable materials without departing from the scope of this invention. It is also contemplated that a heating element (not shown) may be constructed of wire, such as tungsten or molybdenum wire, wrapped on a quartz tube to form a heating coil (not shown). The spacing between the coils may be varied to shape the power output profile of the heating element. The heating element 55 is preferably capable of radiating heat at a temperature in the range of 1000° C.–1100° C. It is understood, however, that heating elements capable of generating temperatures above or below this range may be used and remain within the scope of this invention.

As shown in FIG. 1, the adapter comprises a side wall 77 (broadly, an extender), an annular flange 89 (broadly, an electrode support) attached to the top of the side wall and another annular flange 90 attached to the bottom of the side wall. To mount the adapter 69 in an existing crystal puller 23, the isolation valve housing 32 is disconnected from the transition portion 31 of the growth chamber 27 and the adapter 69 is inserted between the valve housing and the transition portion. The flange 90 at the bottom of the adapter side wall 77 is connected to the dome-shaped transition portion 31 of the housing 25, such as by socket screws (not shown) or other suitable fasteners. The flange 89 at the top of the adapter 69 is connected to the isolation valve housing 32 in a similar manner.

The side wall 77 (broadly, an extender) of the adapter 69 is sized in cross-section to be substantially the same as that of the receiving chamber. The side wall 77 is constructed of concentric tubes 79 spaced apart radially to define a passageway 81 extending along the height of the side wall for containing cooling water for cooling the side wall of the adapter. Baffles 83 disposed between the tubes 79 direct cooling water through the passageway 81. Cooling chambers 85 at the bottom of the side wall 77 each have internal passages 87 for receiving cooling water into the adapter 69 and directing cooling water to the passageway 81 in the adapter side wall 77. Conduits (not shown) extend between the cooling chambers 85 and between each cooling chamber and a source of cooling water (not shown) for continually directing fresh cooling water from the source of cooling water to the passageway 81 of the adapter side wall 77.

The annular flange 89 extends radially outward from the top of the side wall 77 and has opposing, generally cylindrical passages 91 extending radially therethrough. The passages define respective open inner and outer ends 93, 95 of the flange. As an example, the thickness of the flange 89 shown in FIG. 1 is approximately 2.5 inches, with the diameter of the longitudinally extending passages 91 in the flange being about 1.5 inches. The flange 89 is positioned so that the flange passages 91 are substantially aligned with respective openings 67 in the mounting brackets 65. The inner ends 93 of the flange 89 define openings in the adapter 69 of the upper pull chamber 29 for accessing the interior of the housing 25 to mount the brackets 65 on the wall of the pull chamber. In the illustrated embodiment, the adapter 69, including the concentric tubes 79 of the side wall 77, the cooling chambers 85 and the flanges 89 are a unitary weldment constructed of stainless steel. It is alternatively contemplated that an opposing pair of generally tubular electrode supports (not shown) may be attached to and extend radially outward from the side wall 77 of the adapter 69 so that the passages 91 would extend through the electrode supports instead of the annular flange 89, without departing from the scope of this invention.

Figure 3:
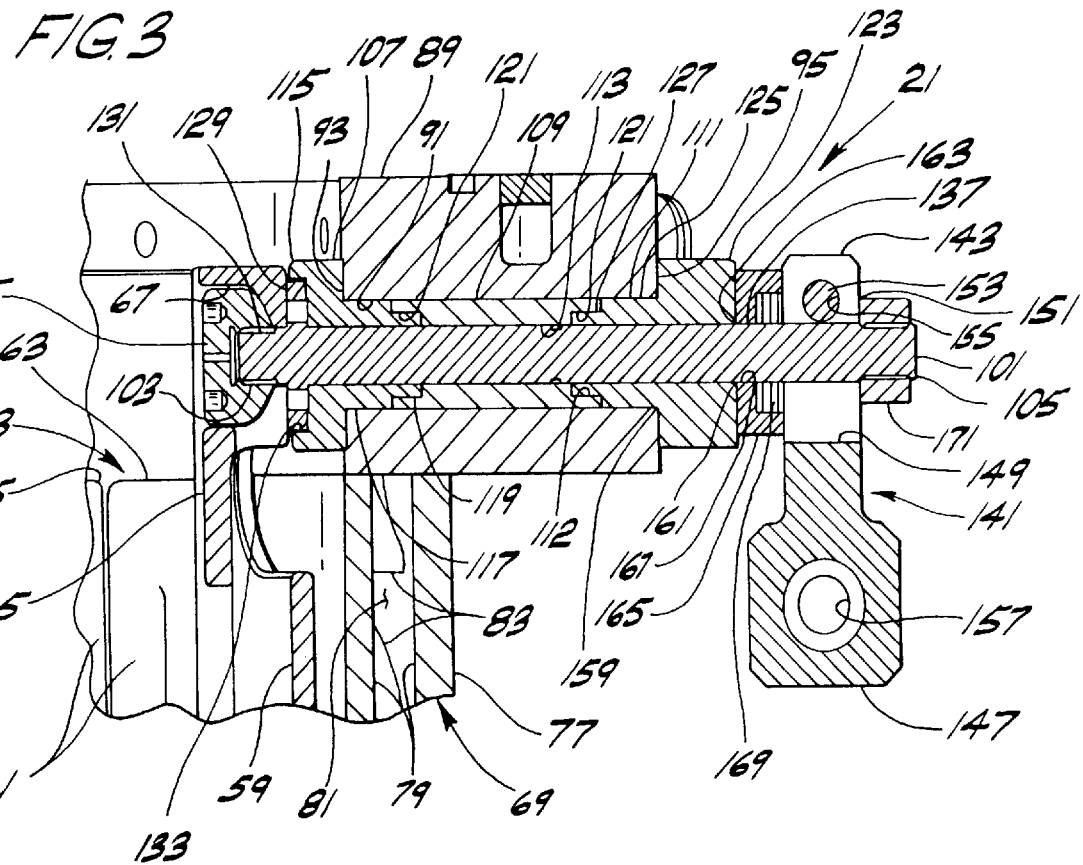
FIG. 3 is an enlarged schematic, fragmentary vertical section a portion of FIG. 1.

For purposes of further describing the electrode assemblies 21 of the present invention, reference will be made to only one assembly, it being understood that the other assembly is of substantially identical construction. Referring to FIG. 3, the electrode assembly 21 comprises an electrode 101 supported in the flange passage 91 in generally concentric relationship with the inner surface of the flange 89. The electrode 101 is of generally solid construction so that the cross-section of the electrode is solid along its entire length and free of any internal cooling passages. The electrode 101 is made of a material capable of withstanding the severe thermal gradients imposed along its length by heat radiated from the upper heater 53 and the growing ingot I being pulled upward through the pull chamber 29. Preferably, the electrode 101 is made of a refractory metal having good electrical conductivity. A particularly preferred metal is tungsten. However, the electrode 101 may be constructed of other materials having similar properties without departing from the scope of this invention. The electrode 101 is sufficiently long so that inner and outer ends 103, 105 of the electrode extend substantially outward of the respective inner and outer ends 93, 95 of the flange 89.

The electrode 101 is held in radially spaced relationship with the inner surface of the flange 89 by bushings disposed in the flange passage 91 including an inner bushing 107, a central bushing 109 and an outer bushing 111. Each of the bushings 107, 109, 111 has a central bore extending longitudinally therethrough and are aligned such that the bores together define an electrode passage 113 extending longitudinally within the flange passage 91 in concentric relationship with the inner surface of the flange 89. The bores are sized so that the electrode 101 extends longitudinally through the electrode passage 91 in generally secure contact with the bushings 107, 109, 111. As shown in FIG. 3, the central bushing 109 has an outer diameter sized for close fitting relationship with the inner surface of the flange 89 so that the bushing seats securely within the flange.

The diameter of the electrode 101 is selected to be sufficiently small to minimize the overall diameter of the electrode assembly 21, but large enough that resistance to the flow of current through the electrode does not create an undesirable amount of heat generated by the electrode. As an example, the electrode 101 shown in FIG. 3 has a diameter of approximately 0.5 inches, while the outer diameter of the central bushing 109 is approximately 1 inch. The electrode 101 is thus supported by the bushings 107, 109, 111 at a radial spacing of about 0.5 inches from the inner surface of the flange 89.

The diameter of the inner bushing 107 is stepped to define a head 115, a central body 117 and a mating section 119. The diameter of the mating section 119 is sized for seating within a recess 121 at the end of the central bushing 109. The central body 117 of the inner bushing 107 has a larger diameter than the mating section 119 so that the central body abuts against the end of the central bushing 109 upon receipt of the mating section 119 in the recess 121 of the central bushing. As with the central bushing 109, the diameter of the central body 117 of the inner bushing 107 is sized for close contacting relationship with the inner surface of the flange 89. The head 115 of the inner bushing 107 has a diameter sized substantially larger than the diameter of the flange passage 91 so that the head abuts against the flange 89 at the inner end of the passage and extends into the interior of the pull chamber 29 upon insertion of the bushing into the flange passage. It will be seen that the stepped configuration of the inner bushing 107 allows for piloted fitting of the inner bushing with the central bushing 109 upon insertion of the inner bushing in the flange passage 91. The outer bushing 111 is constructed in a manner substantially similar to the inner bushing 107, including a head 123, a central body 125 and a mating section 127. The head 123 is sized for abutting the flange 89 at the outer end of the passage 91 when the outer bushing is inserted in the flange passage.

The bushings 107, 109, 111 are each constructed of an electrically insulating (e.g., non-conducting) material capable of withstanding the high thermal loads radiated by the heater 53 and growing ingot I so that the electrode 101 is insulated against the ground potential of the flange 89. Quartz and other ceramic materials are particularly preferred materials for construction of the bushings. Overlapping the central bushing 109 and the mating sections 119, 127 of the inner and outer bushings 107, 111 in this manner assures a minimum electrical conduction gap 112 of 0.5 inches between the electrode 101 and the inner surface of the flange 89 along substantially the entire length of the bushings. In other words, the overall length of the gap 112 between the bushings 107, 109, 111 is longer than the distance that the operation voltage of the electrode, such as about 60 volts, can typically arc in a vacuum. This effectively insulates the electrode 101 and inhibits arcing between the electrode and the flange 89 to prevent grounding of the current flowing through the electrode. More preferably, the inner bushing 107 and central bushing 109, which are positioned closer to the heater 53 than the outer bushing 111, are constructed of fused opaque quartz to minimize the radiant transfer of heat longitudinally through the bushings. The outer bushing 111 is more preferably constructed of a fused clear quartz to ensure no porosity so that an effective seal can be maintained between the flange 89, the bushing 111 and the electrode 101 to vacuum seal the interior of the housing 25.

An annular collar 129 is integrally formed with the electrode 101 adjacent its inner end 103, defining a heater connecting portion 131 of the electrode between the collar and the inner end of the electrode. A recess 133 in the end of the head 115 of the inner bushing 107 is sized for receiving the collar 129 of the electrode 101. The inner face of the collar 129 abuts against the outer surface of the mounting bracket 65 of the heating element 55 in electrical contact therewith for conducting electrical current from the electrode 101 through the mounting bracket and to the heating element. The connecting portion 131 of the electrode 101 extends inward through the opening 67 in the mounting bracket 65. A spanner nut 135 constructed of a suitable graphite material is fitted on the inner end 103 of the electrode and tightened against the mounting bracket 65 to hold the bracket in electrical engagement with the collar 129 of the electrode during operation of the crystal puller 23.

An outer portion 137 of the electrode 101 extends outward beyond the flange 89 and outer bushing 111 for receiving electrical current from a source of electrical current (not shown). A power connector 139 (FIG. 2) leading from the source of electrical current supplies current to an electrical conductor, generally indicated at 141, clamped to the electrode 101 adjacent its outer end 105. In the illustrated embodiment, the power connector 139 is a water-cooled connector capable of concurrently delivering electrical current and cooling media, such as water, from respective sources of electrical current and cooling water to the electrical conductor 141. It is contemplated, however, that a non-water-cooled electrical power connector (not shown) and separate water-cooling hose (not shown) may be used to deliver electrical current and cooling water to the electrical conductor 141 and remain within the scope of this invention. An electrically non-conductive hose 140 extends between the electrical conductors 141 to complete a cooling water flow path from the source of cooling water through the conductors 141.

As shown in FIG. 3, the electrical conductor 141 comprises a clamping member 143 capable of clamping the conductor to the outer portion 137 of the electrode 101 and a receiving member 147 capable of being connected to the power connector 139 to receive electrical current and cooling water into the conductor. The clamping and receiving members 143, 147 are constructed of copper and are preferably integrally formed. However, it is understood that the clamping and receiving members 143, 147 may be constructed separately and connected together, such as by welding or other suitable fastening methods, as long as electrical current and heat are capable of being conducted between the members.

The clamping member 143 is generally C-shaped, having a central opening 149 sized for allowing throughpassage of the electrode 101 and opposing ends (one of which is shown in FIG. 3 and indicated at 151) in closely spaced relationship with each other. The clamping member 143 is sufficiently flexible and resilient so that the size of the opening 149 can be adjusted in the manner of a conventional C-clamp. A screw 153 extends tangentially through threaded openings (one of which is shown in FIG. 3 and indicated at 155) in the opposing ends 151 of the clamping member 143 and spans the gap between the ends. Thus it will be seen that turning the screw 153 in a clockwise direction moves the clamping member 143 to a clamping configuration in which the opposing ends 151 are drawn together to reduce the size of the opening 149 until the clamping member clampingly engages the electrode 101 in the opening. Turning the screw 153 counterclockwise moves the clamping member 143 to a non-clamping configuration in which the opposing ends 151 are moved apart by the bias inherent in the resilient clamping member to increase the size of the opening 149 so that the conductor 141 may be fitted onto or removed from the outer portion 137 of the electrode 101.

Figure 2:
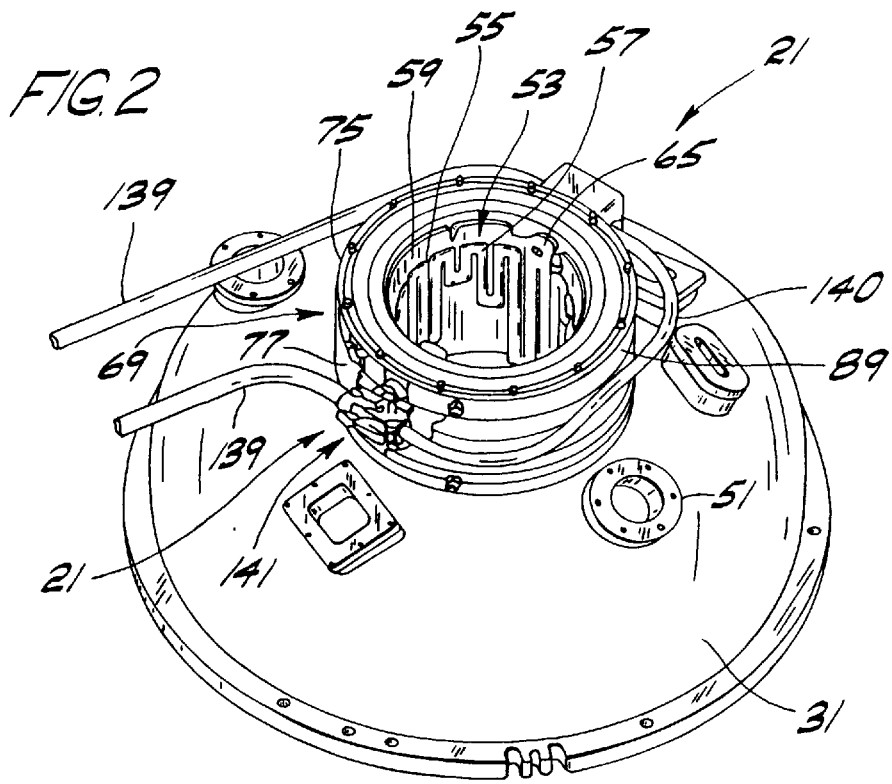
FIG. 2 is a perspective view of an adapter used in modifying conventional crystal pullers to support an electrical resistance heater in the upper pull chamber of the heater, with the adapter supporting the electrode assemblies of FIG. 1.

The receiving member 147 has an internal passage 157 extending generally transversely therethrough for fluid communication with the power connector 139 whereby cooling water from the power connector flows through the internal passage of the receiving member. The temperature and flow rate of the cooling water through the power connector 139 and internal passage 157 of the receiving member 147 is preferably sufficient to cool a portion of the electrode 101 adjacent its outer end 105. As an example, the thermal load along the length of the electrode 101 may be range from a temperature of about 1,000° C. adjacent the inner end 103 of the electrode down to a temperature of about 60° C. along the outer portion 137 of the electrode. As shown in FIG. 2, the power connector 139 extends from the respective sources of electrical current and cooling water to one of the electrical conductors 141, and another power connector extends from the opposite electrical conductor back to the sources of electrical current and cooling water. The electrodes 101 and heater 53 complete the electrical current flow path while the electrically non-conductive hose 140 extending between the conductors 141 completes the cooling water flow path.

O-rings 159, 161 (FIG. 3), or more broadly, sealing members are provided for sealing the electrode assembly 21 to inhibit the loss of vacuum pressure from the interior of the crystal puller housing 25. One O-ring 159 encircles the central body 125 of the outer bushing 111 adjacent the head 123 of the bushing to provide sealing engagement between the bushing and the outer end 95 of the adapter flange 89 upon insertion of the bushing into the flange passage 91. A second O-ring 161 surrounds the electrode 101 and seats generally securely within a recess 163 in the head 123 of the outer bushing 111 to provide a seal between the bushing and the electrode. The O-rings 159, 161 are constructed of a thermally resistant material, preferably an elastomer such as that available under the tradename Viton. However, it is important that the O-rings 159, 161 be located sufficiently close to the cooled outer portion 137 of the electrode 101 so that the O-rings are not heated to temperatures exceeding about 200° C.

It is estimated that the solid electrode 101 will expand axially about 0.01 inches upon exposure to the thermal load of the upper heater 53, which can compromise the sealing integrity of the O-rings 159, 161. To ensure proper vacuum sealing during this expansion, a generally cup-shaped retainer 165 having a central opening 167 at its closed end is fitted on the electrode 101 with the closed end of the retainer abutting against the second O-ring 161 seated in the head 123 of the outer bushing 111. A spring mechanism, such as a set of disc springs 169 (commonly referred to as Belleville springs or washers), are disposed generally in the retainer 165. In their undeflected configuration, the outermost disc springs 169 extend outward of the retainer 165 for engagement by the clamping member 143 of the electrical conductor 141. The retainer 165 and disc springs 169 together broadly define a biasing member for maintaining the second O-ring 161 in sealing engagement with the electrode 101 and outer bushing 111 and the first O-ring 159 in sealing engagement with the outer bushing 111 and the flange 89.

A retaining nut 171 is provided on the outer end 105 of the electrode 101 whereby tightening the nut against the clamping member 143 of the electrical conductor 141 urges the conductor longitudinally against the disc springs 169 to move the springs to a compressed configuration in which the springs are compressed in the retainer 165 against the bias of the springs. The retaining nut 171 secures the springs 169 in the compressed configuration. The compressed springs 169 apply a biasing force against the closed end of the retainer 165 to press the retainer tight against the second O-ring 161 for maintaining a tight seal of the second O-ring with the electrode 101 and the outer bushing. The biasing force also maintains a tight seal of the first O-ring 159 with the outer bushing 111 and the flange 89. As an example, the disc springs 169 are preferably capable of generating a biasing force in the range of about 300–400 lbs. when the electrode 101 is at room temperature prior to operation of the crystal puller 23. The number and orientation of the disc springs 169 is preferably selected such that at least about 80% of this sealing force is maintained during expansion of the electrode diameter under the thermal loading of the heater 53.

Those familiar with the structural properties inherent in quartz and other ceramic materials will recognize that the bushings 107, 109, 111 supporting the electrode 101 in the flange passage 91 lack good transverse rupture strength. Misalignment of the bushings 107, 109, 111 or imperfections on the mating surfaces of the bushings can create high localized stresses when the closed end of the retainer 165 is urged against the outer bushing by the biasing force of the disc springs 169, thereby increasing the risk of cracking. To this end, thin gaskets (not shown) are positioned on the cooled outer portion 137 of the electrode 101 between the disc spring retainer 165 and the outer bushing head 123, and between the outer bushing head and the outer end 105 of the adapter flange 89. The gasket is preferably constructed of a low stiffness material capable of conforming to the surface imperfections and any misalignment present between the retainer 165 and outer bushing 111, and between the outer bushing and the adapter flange 89. A particularly preferred gasket material is silicone rubber. The gaskets are sufficiently thin so that the O-ring 161 between the retainer 165 and outer bushing 111 is the primary component engaged by the retainer upon compression of the disc springs 169.

To mount the upper heater 53 in the upper pull chamber 29 of the housing 25, the electrode 101 is inserted through the inner end 93 of the flange 89, outer end 105 first, until the collar 129 adjacent the inner end 103 of the electrode seats within the recess 133 in the inner bushing head 115. The mounting bracket 65 of the heating element 55 is mounted on the connecting portion 131 of the electrode 101 extending into the pull chamber 29 so that the electrode extends through the opening 67 in the mounting bracket 65 and the bracket abuts against the collar 129 of the electrode. The spanner nut 135 is fitted onto the connecting portion 131 of the electrode 101 and tightened against the mounting bracket 65 to secure the mounting bracket on the electrode in electrical engagement with the electrode collar 129.

The disc spring retainer 165 is slid onto the outer end 105 of the electrode 101 and moved into abutting relationship against the second O-ring 161 seated in the head 123 of the outer bushing 111. The disc springs 169 are placed on the electrode 101 generally within the retainer 165 in their undeflected configuration. The clamping member 143 of the electrical conductor 141 is seated on the electrode 101 in its non-clamping configuration and slid inward along the outer portion 137 of the electrode until it abuts against the outermost disc spring 169. The retaining nut 171 is then placed over the outer end 105 of the electrode 101 and tightened against the clamping member 143 of the electrical conductor 141 to urge the conductor further inward along the electrode, thereby compressing the springs 169 to their compressed configuration. The nut 171 secures the conductor 141 against longitudinal movement relative to the electrode 101 so that the springs 169 are held in the compressed configuration. The biasing force of the springs 169 urges the closed end of the retainer 165 against the O-ring 161 seated in the head 123 of the outer bushing 111 to effect a tight seal between the outer bushing head and the electrode 101.

The screw 153 associated with the clamping member 143 of the electrical conductor 141 is turned clockwise to move the clamping member to its clamping position to secure the electrical conductor to the outer portion 137 of the electrode 101 in electrical and thermal engagement therewith. The power connector 139 is connected to the receiving member 147 of the electrical conductor 141 so that cooling water flowing through the connector is directed through the internal passage 157 of the receiving member as electrical current from the source of electrical current is delivered to the receiving member.

Upon activation of the crystal puller 23, electrical current and cooling water are simultaneously conducted through the power connector 139 to the receiving member 147 of the electrical conductor 141. Electrical current received by the receiving member 147 is conducted through the clamping member 143 to the outer portion 137 of the electrode 101 engaged by the clamping member. Current travels longitudinally inward along the electrode 101 to the collar 129 adjacent the inner end 103 of the electrode 101, where the current is conducted to the mounting bracket 65 mounted in the upper pull chamber 29 of the puller housing 25. Electrical current flows down the mounting bracket 65 and through the heating element 55 in a conventional manner. Current then flows up through the opposing mounting bracket 65 and through the opposing electrode assembly 21 for conduction through the power connector 139 back to the source of electrical current. As current flows through the electrically resistive material of the heating element 55, heat is generated by the heating element and radiated to the growing ingot I and to the walls of the growth chamber 27 and upper pull chamber 29. The electrically non-conductive water hose 140 extending between the electrical conductors 141 completes the cooling water flow path.

Since the connecting portion 131 of the electrode 101 extends within the pull chamber 29, it is exposed to the severe thermal loading radiated by the heating element 55 and growing ingot I being pulled upward through the pull chamber. Heat is conducted longitudinally outward along the length of the solid electrode 101 toward the outer portion 137 of the electrode. Cooling water directed through the power connector 139 flows continuously through the internal passage 157 in the receiving member 147 of the electrical conductor 141. Heat conducted to the outer portion 137 of the electrode 101 is extracted from the electrode by the electrical conductor 141 and then further conducted to the cooling water in the internal passage 157 so that the outer portion 137 of the electrode remains relatively cooled.

The electrode assemblies 21 of the present invention are shown and described herein as used with an adapter 69 to equip existing crystal pullers 23 with the upper pull chamber heater 53 and associated electrode assemblies. However, it is understood that the electrode assemblies 21 may be integrally designed into new crystal pullers, so that no adapter is required, without departing from the scope of this invention.

It will be observed from the foregoing that the electrode assemblies 21 described herein satisfy the various objectives of the present invention and attain other advantageous results. Importantly, the electrodes 101 are of solid cross-section along its length and free of any internal cooling passages, allowing the electrodes and hence the overall electrode assemblies 21 to be sized smaller than conventional water-cooled electrode assemblies. As such, the adapter 69 used for mounting the electrode assemblies 21 on existing crystal pullers 23 can be made less expensive than if conventional water-cooled electrode assemblies are installed in the puller. Moreover, passing cooling water through the electrical conductors 141 effectively extracts heat from the outer portions 137 of the electrodes 101 to reduce the thermal loading in the electrodes.

In addition, the disc springs 169 and retainers 165 provide sufficient biasing force against the O-rings 161 between the outer bushing heads 123 and the electrodes 101 to effectively seal the assemblies 21 against the loss of vacuum pressure in the crystal puller 23 upon expansion of the electrodes when exposed to the thermal loading of the heater 53.

As various changes could be made in the above constructions without departing from the scope of the invention, it is intended that all matter contained in the above description or shown in the accompanying drawings shall be interpreted as illustrative and not in a limiting sense.

What is claimed is:

1. A crystal puller for growing monocrystalline silicon ingots according to the Czochralski method, the crystal puller comprising:

a housing having a bottom and a side wall;

crucible in the housing for containing molten silicon;

a pulling mechanism for pulling a growing ingot upward from the molten silicon;

a crucible heater located in the housing generally adjacent the crucible for heating the crucible to melt silicon in the crucible;

an upper heater separate from the crucible heater and located in the housing generally above the crucible for radiating heat within the housing generally toward the growing ingot pulled upward from the molten silicon by the pulling mechanism;

an electrode having a first end in electrical connection with the upper heater within the housing and an outer end, the electrode extending generally radially outward through the side wall of the crystal puller housing such that the outer end of the electrode is generally external of the housing, the electrode being in electrical communication with a source of electrical current for conduction inward along the electrode to the upper heater located in the housing; and a flange extending outward from the side wall of the housing for supporting the electrode, the flange including a passage extending longitudinally therethrough, the electrode being supported within the flange passage in spaced relationship with the flange, the electrode being electrically insulated against grounding contact with the flange.

2. A crystal puller as set forth in claim 1 wherein the electrode is supported in the flange passage by a bushing, the bushing being constructed of a non-conductive material to insulate the electrode against grounding contact with the flange.

3. A crystal puller as set forth in claim 2 wherein the bushing is constructed of quartz.

4. A crystal puller as set forth in claim 2 wherein the bushing is at least partially constructed of a non-porous material to seal the interior of the crystal puller housing.

5. A crystal puller as set forth in claim 2 further comprising a sealing member for sealingly engaging the electrode and bushing to seal the interior of the crystal puller housing, and a biasing member for biasing the sealing member into sealing engagement with the electrode and bushing.

6. A crystal puller as set forth in claim 5 wherein the sealing member is an O-ring constructed of an elastomeric material, the O-ring surrounding the electrode in abutting relationship with an end of the bushing, the biasing member comprising a retainer positioned in abutting relationship with the O-ring opposite the bushing and a spring mechanism capable of applying a biasing force against the retainer whereby the retainer pushes against the O-ring to maintain the O-ring in sealing engagement with the electrode and bushing.

7. An adapter for use in modifying a crystal puller used for growing monocrystalline silicon ingots according to the Czochralski method to mount a heater in a housing of the puller, the crystal puller housing having a growth chamber and a pull chamber, the housing being separable at an intersection between the growth chamber and the pull chamber, the adapter comprising:

a generally tubular extender sized for insertion between the growth chamber and pull chamber such that the extender partially defines the housing; and connecting flanges attached to the top and bottom of the extender for use in connecting the extender to the growth chamber and pull chamber of the housing;

the adapter having an opening therein to permit access to the heater from exterior of the housing for conducting electrical current to the heater from a source of electrical current located external of the housing.

8. An adapter as set forth in claim 7 further comprising an electrode support extending outward from the extender for supporting an electrode in electrical connection with the heater in the housing, said support being in registry with the opening in the adapter such that the electrode supported by said support extends into the interior of the housing through said opening in the the adapter.

9. An adapter as set forth in claim 8 wherein the flange attached to the top of the extender defines the electrode support.

10. An electrode assembly for use with an electrical resistance heater mounted in a housing of a crystal puller used for growing monocrystalline silicon ingots according to the Czochralski method, the electrode assembly comprising:

an electrode having a first end in electrical connection with the heater within the housing and an outer end, the electrode extending through the crystal puller housing such that the outer end of the electrode is generally external of the housing, the portion of the electrode within the housing being solid in cross-section along the entire length of said portion; and a conductor in thermally conductive engagement with a portion of the electrode extending externally of the housing for extracting heat from the electrode.

11. An electrode assembly as set forth in claim 10 wherein the conductor communicates with an outer surface of the electrode substantially adjacent the outer end of the electrode.

12. An electrode assembly as set forth in claim 10 herein the conductor has internal passageways formed therein for conducting a cooling media therethrough to extract heat from the conductor, heat from the electrode being extracted by the conductor.

13. An electrode assembly as set forth in claim 12 wherein the conductor is an electrical conductor adapted for connection to the electrode externally of the housing for conducting electrical current to the electrode.

14. A crystal puller for growing monocrystalline silicon ingots according to the Czochralski method, the crystal puller comprising:

a housing;

a crucible in the housing for containing molten silicon;

a pulling mechanism for pulling a growing ingot upward from the molten silicon;

a heater located in the housing for radiating heat within the housing;

an electrode having a first end in electrical connection with the heater within the housing and an outer end, the electrode extending through the crystal puller housing such that the outer end of the electrode is generally external of the housing, the portion of the electrode within the housing being solid in cross-section along the entire length of said portion, the electrode being in electrical communication with a source of electrical current for conduction inward along the electrode to the heater located in the housing; and a conductor positioned generally externally of the housing in thermally conductive communication with the electrode for extracting heat from the electrode.

15. A crystal puller as set forth in claim 11 wherein the electrode is constructed of an electrically conductive refractory metal.

16. A crystal puller as set forth in claim 15 wherein the electrode is constructed of tungsten.

17. A crystal puller as set forth in claim 16 wherein said conductor communicates with an outer surface of the electrode substantially adjacent the outer end of the electrode.

18. A crystal puller as set forth in claim 16 wherein said conducter is comprises an electrical conductor adapted for connection to the electrode substantially adjacent the outer end of the electrode for conducting electrical current to the electrode, the conductor having internal passageways formed therein for conducting a cooling media therethrough to extract heat from the conductor, heat from the electrode being extracted by the conductor.

19. A crystal puller for growing monocrystalline silicon ingots according to the Czochralski method, the crystal puller comprising:

a housing;

a crucible in the housing for containing molten silicon;

a pulling mechanism for pulling a growing ingot upward from the molten silicon;

a heater located in the housing for radiating heat within the housing;

an electrode having a first end in electrical connection with the heater within the housing and an outer end, the electrode extending through the crystal puller housing such that the outer end of the electrode is generally external of the housing, the portion of the electrode within the housing being generally solid in cross-section along the entire length of said portion and free of any internal cooling passages the electrode being in electrical communication with a source of electrical current for conduction inward along the electrode to the heater located in the housing; and a flange extending outward from the housing for supporting the electrode, the flange including a passage extending longitudinally therethrough, the electrode being supported within the flange passage in spaced relationship with the flange, the electrode being electrically insulated against grounding contact with the flange, said electrode being supported in the flange passage by a bushing, the bushing being constructed of a nonconductive material to insulate the electrode against grounding contact with the flange.

* * * * *

UNITED STATES PATENT AND TRADEMARK OFFICE
CERTIFICATE OF CORRECTION

PATENT NO. : 6,287,382 B1
DATED : September 11, 2001
INVENTOR(S) : Carl F. Cherko It is certified that error appears in the above-identified patent and that said Letters Patent is hereby corrected as shown below:

Column 12,
Line 62, please change "crucible" to read -- a crucible --.

Column 14,
Line 26, please change "herein" to read -- wherein --.
Line 63, please change "16" to read -- 14 --.
Line 66, please change "16" to read -- 14 --.
Line 67, please change "conducter is comprises an" to read -- conductor is an --.

Column 16,
Line 17, please change "nonconductive" to read -- non-conductive --.

Signed and Sealed this

Twenty-third Day of July, 2002

Attest:

Attesting Officer

JAMES E. ROGAN
*Director of the United States Patent and Trademark Office*